United States Patent [19]

Nakano et al.

[11] Patent Number: 5,726,457
[45] Date of Patent: *Mar. 10, 1998

[54] ORGANIC ELECTROLUMINESCENCE DEVICE

[75] Inventors: Tsuyoshi Nakano; Shuji Doi; Takanobu Noguchi; Toshihiro Ohnishi; Yasushi Iyechika, all of Tsukuba, Japan

[73] Assignee: Sumitomo Chemical Company, Limited, Osaka, Japan

[*] Notice: The term of this patent shall not extend beyond the expiration date of Pat. No. 5,317,169.

[21] Appl. No.: 444,917

[22] Filed: May 19, 1995

Related U.S. Application Data

[63] Continuation of Ser. No. 136,046, Oct. 14, 1993, abandoned, which is a continuation of Ser. No. 658,639, Feb. 22, 1991, abandoned.

[30] Foreign Application Priority Data

| Feb. 23, 1990 | [JP] | Japan | 2-043930 |
| Mar. 22, 1990 | [JP] | Japan | 2-075225 |
| Oct. 4, 1990 | [JP] | Japan | 2-267870 |

[51] Int. Cl.$^6$ .......................... H01L 35/24; H01L 51/00; H01L 33/00
[52] U.S. Cl. .......................... 257/40; 257/103; 313/504; 313/506; 313/507
[58] Field of Search .......................... 357/8, 17; 313/504, 313/506, 507; 257/40, 103

[56] References Cited

U.S. PATENT DOCUMENTS

| 4,356,429 | 10/1982 | Tang . | |
| 4,528,118 | 7/1985 | Murase et al. . | |
| 4,539,507 | 9/1985 | VanSlyke et al. . | |
| 4,750,816 | 6/1988 | Ito et al. | 350/357 |
| 4,819,057 | 4/1989 | Naito et al. | 357/17 |
| 5,047,687 | 9/1991 | van Slyke | 313/503 |

FOREIGN PATENT DOCUMENTS

| 0319881 | 6/1989 | European Pat. Off. . |
| 9013148 | 11/1990 | WIPO . |

OTHER PUBLICATIONS

Friend, R.H. "Optical Investigations of Conjugated Polymers" J. of Molecular Electronics, vol. 4, 1988 pp. 37–46.
Highly Conducting poly(2,5-thienylene vinylene) via a precursor route. Ichiki Murase, et al., Polymer Communications, 1987, vol. 28, Aug., pp. 229–231.
Polyaniline: Interconversion of Metallic and Insulating Forms Mol. Cryst. Liq. Cryst. 1985, vol. 121, pp. 173–180. A.G. Macdiarmid et al.

(List continued on next page.)

*Primary Examiner*—Jerome Jackson, Jr.
*Attorney, Agent, or Firm*—Watson Cole Stevens Davis, P.L.L.C.

[57] ABSTRACT

Disclosed is an organic electroluminescence device having a light emitting layer or a light emitting layer and a charge transport layer disposed between a pair of electrodes at least one of which is transparent or semi-transparent, the light emitting layer comprising a conjugated polymer having a repeating unit represented by the general formula (1):

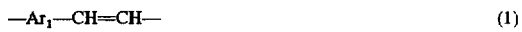

where $Ar_1$ represents an aromatic hydrocarbon group having 6 to 14 carbon atoms or a nuclear-substituted group in which the aromatic hydrocarbon group is substituted by one or two selected from the group consisting of hydrocarbon groups having 1 to 22 carbon atoms and alkoxy groups having 1 to 22 carbon atoms. According to the present invention, the use of a polymer intermediate of the conjugated polymer or the conjugated polymer soluble to a solvent as a light emitting material, a charge transport material or a buffer layer to an electrode enables an EL device having a large area to be easily made.

8 Claims, 1 Drawing Sheet

OTHER PUBLICATIONS

Electroluminescence of Perylene Films with a Conducting Polymer as an Anode, Seiji Hayashi et al., Japanese Journal of Applied Physics, vol. 25, No. 9, Sep. 1986, pp. L773–L775.

Electroluminescence from polyvinylcarbazole films: 3. Electroluminescent devices, R.H. Partridge, Polymer, 1983, vol.24 Jun. pp. 748–754.

Organic Electroluminescent diodes, C.W. Tang, et al., Appl. Phys. Lett., 51, pp. 913–915 (1987).

Electroluminescence in Organic Films, C. Adachi, et al., Japanese Journal of Applied Physics, vol. 27, No. 2, Feb. 1988, pp. L269–L271.

Electroluminescence of doped organic thin films, C.W. Tang, et al. J. Appl. Phys. 65 (9), 1 May 1989, pp. 3610–3616.

ORGANIC ELECTROLUMINESCENCE DEVICE

This application is a continuation of application Ser. No. 08/136,046, filed Oct. 14, 1993, abandoned; which in turn is a continuation of application Ser. No. 07/658,639, filed Feb. 22, 1991, abandoned.

BACKGROUND OF THE INVENTION

1. Field of the Invention

The present invention relates to an organic electroluminescence device, and more particularly, to an organic electroluminescence device which can be easily fabricated and used as a light emitting device for various displays.

2. Description of the Prior Art

Although many trials for fabricating organic electroluminescence devices (hereinafter, referred to as an EL device) have been reported from a view point of the elucidation of the state of electrons of the material thereof, these device have low luminance because a carrier is difficult to inject into a light emitting layer composed of an organic substance (hereinafter referred to as light emitting layer) from an electrode. To solve this problem, Tang et al. made a two layer structure composed of a hole transport layer of an organic substance laminated on an organic emitting layer to realize an EL device with high efficiency and high luminance (U.S. Pat. No. 4,539,507). Thereafter, there are made a device comprising a three layer structure having a light emitting layer disposed between an organic electron transport layer and a hole transport layer of an organic substance (hereinafter, these are collectively referred to as charge transport layers) [Japanese Journal of Applied Physics, 27, page 269 (1988)] and EL devices having light emitting layers which are doped with various dyes to give various colors [Journal of Applied Physics, vol. 65, page 3610 (1989)].

For these organic EL devices reported up to now, the light emitting layer and the charge transport layers were made by vapor depositing an organic substance in vacuum. A vapor deposition method, however, is not suitable for mass-production and has a limit in the production of a device having a large area. Further, when the EL device is used as a back light for illuminating a non-light emitting display such as an LCD and the like, a request to make an area of the EL device larger is increased and the EL device needs to be made on a large scale. Incidentally, when low molecular weight organic fluorescent materials such as tris (8-hydroxyquinoline) aluminum, anthracene, etc., which have been used up to now, are used as the light emitting layer, these materials are difficult to be made to a thin film by coating when they are independently used without matrix materials.

On the other hand, there is a trial to make a light emitting layer by spin coating a polymer semiconductor such as polyvinylcarbazole in which a fluorescent substance such as perylene, triphenylbutadiene, etc. is dispersed [Polymer, 24, 748 (1983)], but this trial has a problem because of low luminance. Therefore, a method for making a thin film for highly luminant EL devices could not help being restricted to limited methods such as a vapor deposition method, etc.

The organic EL device made by the vapor deposition has a problem in that it has lower light emitting luminance and light emitting efficiency per electric power than other light emitting devices. To solve this problem, it is needed that an efficiency of charge injection from an electrode is improved to realize a high luminance with a low drive voltage. Further, when the EL device acts as a display, a light must be uniformly emitted over a large area. An organic thin film layer constituting the organic EL device has a very thin film thickness of about 1000 angstroms, and thus a problem is also pointed in that a light is liable to be irregularly emitted which is supposed to be caused by an irregular substrate and an uneven electrode.

SUMMARY OF THE INVENTION

The inventors have found that when a polymer having a short conjugated chain is used as a light emitting material, the polymer can be easily made to a thin film by a spin coating method, a casting method, etc. and an EL device excellent in uniformity can be provided by using the polymer, as the result of a study with an attention paid to the fact that conjugated polymers, which have been studied as conducting polymers, include a fluorescent material. Further, it has been found that a conducting polymer having a sufficiently long conjugaged chain can be used as a charge transport material and can provide an EL device excellent in uniformity. Further, the inventors have reached the present invention by finding that a conducting polymer layer, which is disposed between a charge transport layer(s) and an electrode of an organic EL device comprising a light emitting layer and the charge transport layer(s), remarkably improves the uniformity of a light emission, light emitting efficiency and luminance.

An object of the present invention is to provide an EL device which uses a specific conjugated polymer as a light emitting layer and is excellent in the uniformity of light emission.

Another object of the present invention is to provide an EL device which uses a specific conducting polymer as a charge transport layer and is excellent in the uniformity of light emission over the whole surface of the device.

A further object of the present invention is to provide an EL device which has a specific conducting polymer layer disposed between a charge transport layer and an electrode and is excellent in the uniformity of light emission, light emitting efficiency, and luminance.

More specifically, the present invention relates to an organic electroluminescence device having a light emitting layer or a light emitting layer and a charge transport layer disposed between a pair of electrodes at least one of which is transparent or semi-transparent, the light emitting layer comprising a conjugated polymer having a repeating unit represented by the general formula (1):

$$-Ar_1-CH=CH- \qquad (1)$$

where $Ar_1$ represents an aromatic hydrocarbon group having 6 to 14 carbon atoms or its nuclear-substituted group in which the aromatic hydrocarbon group is substituted by one or two selected from the group consisting of hydrocarbon groups having 1 to 22 carbon atoms and alkoxy groups having 1 to 22 carbon atoms.

Further, the present invention relates to an organic electroluminescence device having a light emitting layer and a charge transport layer disposed between a pair of electrodes at least one of which is transparent or semi-transparent, the charge transport layer comprising a conducting polymer having a repeating unit represented by the general formula (2):

$$-Ar_2-B- \qquad (2)$$

where $Ar_2$ represents an aromatic hydrocarbon group having 6 to 14 carbon atoms, a heterocyclic aromatic hydrocarbon group having 4 to 6 carbon atoms and containing nitrogen, sulfur or oxygen, or its nuclear-substituted group in which the aromatic hydrocarbon group is substituted by one or two selected from the group consisting of hydrocarbon groups having 1 to 22 carbon atoms and alkoxy groups having 1 to 22 carbon atoms, and B represents a —CH=CH— group or an —NH— group.

Further, the present invention relates to an organic electroluminescence device having a light emitting layer and a charge transport layer disposed between a pair of electrodes at least one of which is transparent of semi-transparent, comprising a conducting polymer layer as a buffer layer disposed between the charge transport layer and the electrode, the conducting polymer having a repeating unit represented by the general formula (2):

$$—Ar_2—B— \quad (2)$$

where $Ar_2$ and B are the same as defined above.

DESCRIPTION OF THE PREFERRED EMBODIMENTS

Figure 1:
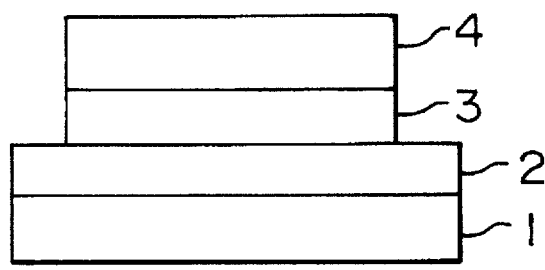
FIGS. 1 to 3 show conceptual cross sectional views of examples of the organic electroluminescence device according to the present invention.

The EL device according to the present invention will be described below in detail.

A method of synthesizing a conjugated polymer represented by the general formula (1) and a conducting polymer having a —CH=CH— group represented by the general formula (2) used as an element of the organic. EL device according to the present invention are not particularly limited, but, for example, several known methods described below can be used.

According to the sulfonium salt decomposition method described in U.S. Pat. No. 4,528,118, first, a monomer represented by the general formula (3):

$$G—CH_2—Ar_3—CH_2—G \quad (3)$$

[$Ar_3$ has the same meaning as $Ar_1$ or $Ar_2$ described above and G represents

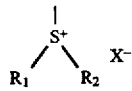

($R_1$ and $R_2$ each represent an alkyl group having 1 to 8 carbon atoms and $X^-$ represents a counteranion)] is reacted with an alkali in water at about 0° C. to obtain a polymer intermediate having a sulfonium salt as a side chain and having a repeating unit represented by the general formula (4):

$$—Ar_3—\underset{\underset{R_1\phantom{xx}R_2}{\diagup S^+ \diagdown \phantom{x} X^-}}{CH}—CH_2— \quad (4)$$

($Ar_3$, $X^-$, $R_1$ and $R_2$ are the same as defined above). The thus obtained polymer intermediate having a sulfonium salt as a side chain is reacted with an alcohol to obtain a polymer intermediate having an alkoxy group as a side chain and having a repeating unit represented by the general formula (5):

$$—Ar_3—\underset{\underset{OR_3}{|}}{CH}—CH_2— \quad (5)$$

($Ar_3$ is the same as defined above and $R_3$ represents a hydrocarbon group having 1 to 12 carbon atoms such as methyl, ethyl, propyl or butyl). Alternatively, the above polymer intermediate having a sulfonium salt as a side chain is reacted with an aromatic sulfonic acid to obtain a polymer intermediate having a sulfonic acid salt as a side chain.

These three polymer intermediates are subjected to a heat treatment to obtain the conjugated polymer represented by the general formula (1) or the general formula (2) wherein B is —CH=CH—.

When $Ar_1$ or $Ar_2$ is a non-substituted aromatic hydrocarbon group or its nuclear-substituted group in which the aromatic hydrocarbon group is substituted by an alkyl or alkoxy having 3 or less carbon atoms, the conjugated polymer represented by the general formula (1) or (2) is very difficult to dissolve in a solvent. The polymer intermediates obtained by the above method can be, however, dissolved in a solvent and therefore their solution can be made to a thin film by coating means and subjected to an elimination reaction of their side chains, as described hereinbelow. Thus, the thin films of the conjugated polymers can be prepared.

When $Ar_1$ or $Ar_2$ is a nuclear-substituted group in which its aromatic hydrocarbon group is substituted by an alkyl or alkoxy having 4 or more carbon atoms and B is —CH=CH—, the conjugated polymers themselves can be dissolved in a solvent and therefore a dehydrohalogenation method, a Wittig reaction method, etc. can be applied.

According to the dehydrohalogenation method, first, a dihalogenide compound represented by the general formula (6):

$$X_2—CH_2—Ar_3—CH_2—X_2 \quad (6)$$

($Ar_3$ is the same as defined above and $X_2$ represents a halogen) is subjected to condensation polymerization by an alkali such as potassium t-butoxide, etc. in a solution to obtain the conjugated polymer represented by the general formula (1) or the conducting polymer represented by the general formula (2) wherein B is —CH=CH—.

According to a Wittig reaction method, triphenylphosphine, etc. is reacted with a dihalogenide compound represented by the above general formula (6) to make a phosphonium salt, and a dialdehyde compound (CHO—$Ar_3$—CHO) is reacted with the phosphonium salt to obtain the conjugated polymer represented by the general formula (1) or the conducting polymer represented by the general formula (2) wherein B is —CH=CH—.

When B is —NH— in the conducting polymer represented by the general formula (2) used in the present invention, the conducting polymer is preferably polyaniline and the derivatives thereof which are obtained by the electrochemical polymerization of aniline or the derivatives thereof, or the chemical polymerization of the same, by a known method, and more preferably is polyaniline.

To dissolve the polyaniline and the derivatives thereof in a solvent in high concentrations, a method of treating them with an alkali solution is used after they have been polymerized. Sodium hydroxide, potassium hydroxide, aqueous ammonia, hydrazine, etc. can be used as an alkali. The degree of polymerization of polyaniline and the derivatives thereof is preferable 0.1 dl/g or more in terms of limiting viscosity [η] (in N-methyl-2-pyrrolidone at 30° C.).

$Ar_1$ in the conjugated polymer represented by the general formula (1) includes, for example, aromatic hydrocarbon groups such as p-phenylene, 2,6-naphthalenediyl, 9,10-anthracenediyl. Substituted groups on the aromatic hydrocarbon group include hydrocarbon groups having 1 to 22 carbon atoms such as methyl, ethyl, propyl, butyl, pentyl, hexyl, heptyl, octyl, lauryl and octadecyl, and alkoxy groups having 1 to 22 carbon atoms such as methoxy, ethoxy, propoxy, pentyloxy, hexyloxy, heptyloxy, octyloxy, lauryloxy, octadecyloxy, etc. Therefore, the nuclear-substituted aromatic group includes mono $C_{1-22}$ alkyl-p-phenylene, mono $C_{1-22}$ alkoxy-p-phenylene, 2,5-di $C_{1-22}$ alkyl-p-phenylene, 2,5-di $C_{1-22}$ alkoxy-p-phenylene, more specifically monomethyl-p-phenylene, monomethoxy-p-phenylene, 2,5-dimethyl-p-phenylene, 2,5-dimethoxy-p-phenylene, monoethyl-p-phenylene, 2,5-diethoxy-p-phenylene, 2,5-diethyl-p-phenylene, monobutyl-p-phenylene, monobutoxy-p-phenylene, monobutyl-p-phenylene, 2,5-dibutoxy-p-phenylene, 2,5-diheptyl-p-phenylene, 2,6-diheptyloxy-p-phenylene, 2,5-dioctyl-p-phenylene, 2,5-dioctyloxy-p-phenylene, 2,5-dilauryl-p-phenylene, 2,5-dilauryloxy-p-phenylene, 2,5-distearyl-p-phenylene, 2,5-distearyloxy-p-phenylene, etc. Among them, p-phenylene, 2,5-di $C_{1-22}$ alkyl-p-phenylene, 2,5-di $C_{1-22}$ alkoxy-p-phenylene is preferred because the resulting organic EL device has a high light emitting luminance. More preferred are p-phenylene, 2,5-dimethoxy-p-phenylene, 2,5-diethoxy-p-phenylene, 2,5-dibutoxy-p-phenylene, 2,5-diheptyloxy-p-phenylene, 2,5-dilauryloxy-p-phenylene.

When B is —CH=CH— in the conducting polymer represented by the general formula (2) used in the present invention, $Ar_2$ represents a heterocyclic aromatic hydrocarbon group having 4 to 6 carbon atoms and containing nitrogen, sulfur, or oxygen in addition to an aromatic hydrocarbon group similar to the above $Ar_1$. Further, a substituted group on the nuclear-substituted aromatic hydrocarbon group includes a hydrocarbon group having 1 to 22 carbon atoms and an alkoxy group having 1 to 22 carbon atoms similar to the above $Ar_1$. Specific examples of the nuclear-substituted aromatic group are the same as those of the $Ar_1$. The heterocyclic aromatic hydrocarbon group includes, for example, 2,5-thienylene, 2,5-furandiyl, 2,5-pyrroldiyl. Further, the nuclear-substituted heterocyclic aromatic hydrocarbon group having 4 to 6 carbon atoms includes, for example, 2,5-thienylene, 2,5-furandiyl and 2,5-pyrroldiyl having the 3-position and/or the 4-position which is substituted by the above hydrocarbon group or alkoxy group. Preferable are p-phenylene, 2,5-di $C_{1-22}$alkoxy-p-phenylene, 2,5-thienylene, 3-$C_{1-22}$ alkyl-2,5-thienylene, 2,5-di $C_{1-22}$ alkoxy-2,5-thienylene.

More preferable are p-phenylene, 2,5-dimethoxy-p-phenylene, 2,5-diethoxy-p-phenylene, 2,5-dipropoxy-p-phenylene, 2,5-dibutoxy-p-phenylene, 2,5-thienylene.

To obtain a uniform thin film by a spin coating method or a casting method using the conjugated polymer of the general formula (1) or the conducting polymer of the general formula (2), the molecular weight of their intermediates or the conjugated polymer must be sufficiently high. A degree of polymerization is 5 or more, and preferably 10 to 50000. Specifically, those which has a high molecular weight to be eluted before a solvent elusion position corresponding to a standard polystyrene with a molecular weight of 2800 in the measurement of molecular weights by gel permeation chromatography, is more effective.

Counteranion $X^-$ of the sulfonium salt of the polymer intermediate obtained by the monomer represented by the general formula (3) include halogen ions such as $Cl^-$, $Br^-$, etc. and further compound ions such as $BF_4^-$, p-toluene sulfonic acid ions, etc. obtained by substituting the halogen ions thereof. The polymer intermediate sulfonium salt has a different property depending on the type of the counteranions, and when the halogen ions are taken as an example, a heat elimination reaction is liable to occur when the counteranion is $Br^-$ rather than $Cl^-$. When the counteranion is $BF_4^-$, they are soluble to an organic solvent such as N,N-dimethylformamide, etc., and when the counteranion is p-toluene sulfonic acid ions, the side chain of the polymer intermediate sulfonium salt may be converted into an alkoxy group.

A side chain is subjected to an elimination treatment to convert the polymer intermediate into the conjugated polymer. Although the elimination treatment is generally carried out by light exposure or heating, the heat treatment is preferable. When a conjugate chain is formed by subjecting the side chain to the heat elimination treatment, the conjugate chain length can be regulated by a temperature at which the heat treatment is carried out. More specifically, at the higher temperature within a predetermined temperature the heat treatment is carried out, the longer the conjugate chain is extended.

The sulfonium salt decomposition method, dehydrohalogenation method, and Wittig method among the above synthesizing methods are preferable because these methods can easily control the molecular weight and the conjugate length to obtain a conjugated polymer exhibiting strong fluorescence as the light emitting material represented by the general formula (1).

Since the sulfonium salt decomposition method provides a polymer intermediate of a conjugated polymer, the polymer intermediate is subjected to a heat treatment to be converted into the conjugated polymer. The heat treatment is preferably carried out at a relatively low temperature to obtain a conjugated polymer having a strong emitting light. Specifically, the heat treatment is preferably carried out at 80° C. to 200° C.

Note that methods other than the sulfonium salt decomposition method do not need the heat treatment.

On the other hand, when the conducting polymer represented by the general formula (2) is used for a charge transport layer or a buffer layer, the conducting polymer preferably has a larger molecular weight and a longer conjugate chain. The conjugated polymer obtained by the above methods is further subjected to a heat treatment to eliminate side chains not yet eliminated to thereby obtain a material having a more excellent charge transport characteristic. A heat treatment temperature is preferably 200° C. to 400° C., although it depends on a $Ar_2$ group in the general formula (2).

Note that a polymer intermediate obtained by a sulfonium decomposition method is converted into the conjugated polymer by subjecting to a heat treatment, but when the conjugated polymer is used as a charge transport layer or a buffer layer, the polymer intermediate must be fully subjected to the elimination treatment of the side chains for excellent characteristics. The treatment is preferably carried out at 200° C. to 400° C.

When the conjugated polymer obtained by the sulfonium salt decomposition method is used as a light emitting material, a charge transport material or a buffer layer material, the heat treatment time is not particularly limited, so long as a side chain eliminating reaction arises in the time, and the time is generally 10 minutes to 20 hours, and preferably 30 minutes to 8 hours.

An atmosphere in which the heat treatment is carried out is not particularly limited, so long as a polymer film is not deteriorated and, in particular, an oxidizing reaction is not caused by oxygen and air, and it is generally an inert gas atmosphere such as $N_2$, Ar, He, etc., or the heat treatment may be carried out in vacuum or in an inert liquid medium.

Further, it is known that the conducting polymer of the general formula (2) has an increased electrical conductivity when doped with impurities such as sulfuric acid, iodine, iron (II) chloride, etc. It is also known that, in the state in which the electrical conductivity is increased as described above, absorbance in a visible wavelength region is also increased and optical transmittance is greatly reduced to lose transparency. Therefore, the doping is not preferably carried out when a light emitted is to be taken out from the conducting polymer side of the EL device. Since the absorption spectrum correlates with the electrical conductivity, the electrical conductivity is preferably 0.1 S/cm or less.

Figure 2:
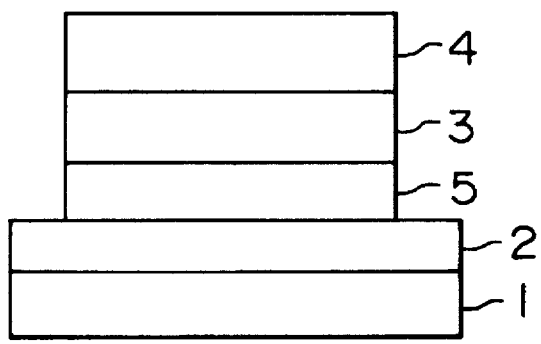
Figure 3:
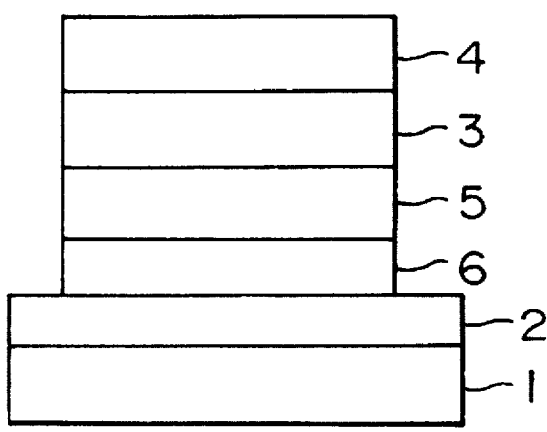

FIGS. 1, 2 and 3 show the structure of the EL device according to the present invention, when the conjugated polymer represented by the general formula (1) is used as a light emitting material, when the conducting polymer represented by the general formula (2) is used as a charge transport layer, and further when the above conducting polymer as a buffer layer is disposed between the charge transport layer and the electrode, respectively.

A transparent electrode 2 formed on a transparent substrate 1 such as glass, transparent plastic, etc. is used as a transparent thin electrode used in a process of manufacturing the EL device. A conducting metal oxide film, a semi-transparent metal film, etc. are used as electrode materials.

Specifically, the electrode material includes indium-tin-oxide (ITO), tin oxide (NESA), Au, Pt, Ag, Cu, etc. The electrode is made by a vacuum vapor deposition, sputtering method, plating method, etc., and the film thickness thereof is about 50 angstroms to about 1 micrometer, and preferably about 100 angstroms to about 500 angstroms.

When the conjugated polymer of the general formula (1) is used as a light emitting layer 3 in the device shown in FIG. 1, a thin film is formed on an electrode 2 from the solution of the polymer or the polymer intermediate thereof. Although the film thickness of the light emitting layer 3 is not particularly limited, it is, for example, 50 angstroms to 10 micrometers and preferably 100 angstroms to 1 micrometer to increase a current density so as to increase a light emitting efficiency. Note that when the polymer intermediate is made to a thin film, it is thereafter subjected to a heat treatment and the like at 80°–200° C. so that it is converted into the corresponding conjugated polymer.

The light emitting layer 3 may be used independently, or further in combination with a known transport material or a light emitting material. More specifically, the light emitting layer may be combined with the charge transport layer of the conducting polymer according to the present invention or a known charge transport layer or a known light emitting layer.

Next, an electron injection cathode 4 is formed.

When the conducting polymer of the general formula (2) is used as a charge transport layer 5 in the device shown in FIG. 2, a thin film is formed on an electrode from the solution of the polymer or the polymer intermediate thereof. Although the film thickness of the charge transport layer is not particularly limited, it is, for example, 50 angstroms to 10 micrometers and preferably 100 angstroms to 1 micrometer to increase a current density so as to increase a light emitting efficiency. Note that when the polymer intermediate is made to a thin film, it is subjected to a heat treatment at 200° to 400° C. so that it is sufficiently converted into the corresponding conducting polymer. The charge transport layer 5 may be used independently, or the layer of a hole or electron transport material may be further provided therewith. More specifically, the charge transport layer may be combined with the charge transport layer of another conducting polymer according to the present invention or a known charge transport layer. Further, a known light emitting layer 3 is formed on the conducting polymer layer 5 and an electron injection cathode 4 is formed thereon.

When the conducting polymer of the general formula (2) is used as a buffer layer 6 disposed between a charge transport layer and an electrode in the device shown in FIG. 3, a thin film is formed on the electrode from the solution of the polymer or the polymer intermediate thereof. Although the film thickness of the buffer layer 6 is not particularly limited, it is, for example, 50 angstroms to 10 micrometers and preferably 100 angstroms to 1 micrometer and more preferably 100 to 1000 angstroms to increase a current density so as to increase a light emitting efficiency. Note that when the polymer intermediate is made to a thin film, it is thereafter subjected to a heat treatment at a relatively high temperature of 200° to 400° C. so that it is sufficiently converted into the corresponding conducting polymer. The conducting polymer layer is used with a hole transport layer 5 as a known charge transport layer and a light emitting layer 3 laminated thereon. An electron injection cathode 4 is formed thereto. With this arrangement, the uniformity of light emission over the whole surface of the device, a light emitting efficiency and luminance are remarkably improved.

The light emitting layer of the conjugated polymer represented by the general formula (1), the charge transport layer of the conducting polymer represented by the general formula (2) and the buffer layer are made to a thin film by a spin coating method, casting method, dipping method, bar coating method, roll coating method, and vapor deposition to thereby provide a uniform layer having a large area.

Material for the known light emitting layer and charge transport layer is not particularly limited, and known materials such as those disclosed in U.S. Pat. Nos. 4,356,429 and 4,539,507, and the like can be used as the light emitting material. Preferably used as the light emitting material, for example, metal complexes of 8-hydroxy quinoline and the derivatives thereof, naphthalene derivatives, anthracene derivatives, perylene derivatives, cyanine dyes, melocyanine dyes, xanthene dyes, cumaline dyes, styryl dyes, other dyes, aromatic amines, tetraphenyl cyclopentadiene derivatives, tetraphenyl butadiene derivatives, etc. Specifically, preferably used are perylene, tris (8-hydroxyquinoline) aluminum (hereinafter referred to as $Alq_3$), tetracene, tetraphenylbutadiene, tetraphenylcyclopentadiene, 9,11-bisstyrylanthracene, 3,3-diethylthiadicarbocyanineiodine, 1,3-diethyl-5-[(2-(3-ethyl-2-benzothiazolinilidene)ethylidene]-2-thiohydantoin, 4-dicyanomethylene-6-(p-dimethylaminostyryl)-2-methyl-4H-pyrane,

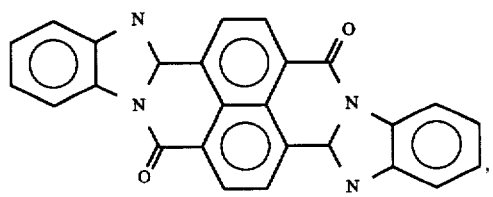

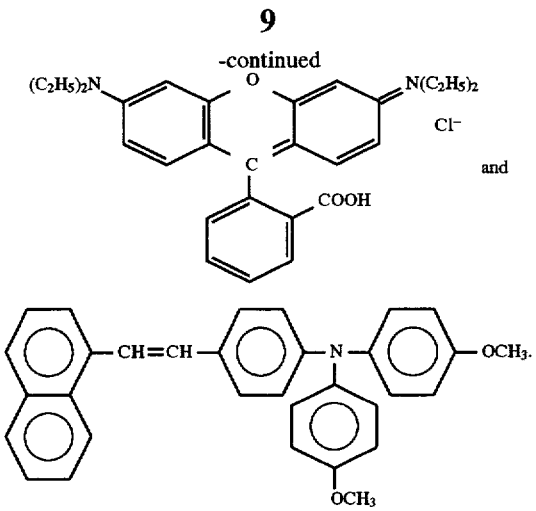

Further, the material for the known hole transport layer includes aromatic amines as listed below.

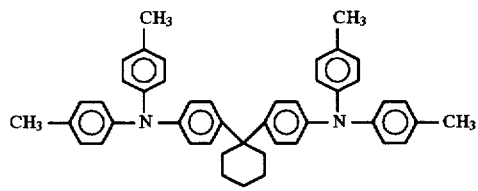

(hereinafter referred to as TAPC),

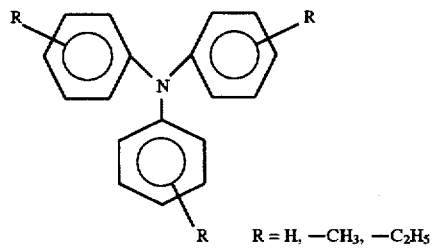

(hereinafter referred to as TPA),

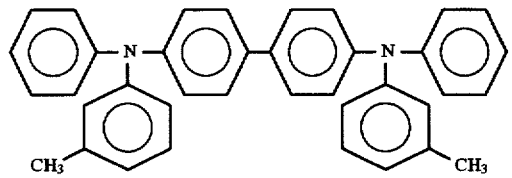

(hereinafter referred to as TPD),

Note that the structure of the organic EL device may be a combined structure of a so-called sandwich structure having an electron transport layer between a light emitting layer and a cathode as well as the (anode/buffer layer/charge transport layer/light emitting layer/cathode) structure shown in FIG. 3. Material for the electron transport layer in this case includes, for example, (hereinafter referred to as PBD). The above-mentioned $Alq_3$ may be used depending on the combination of the layers.

In the structure shown in FIG. 3, the combination of the charge transport layer and light emitting layer may be a bilayer structure of (light emitting layer/charge transport layer) or (charge transport layer/light emitting layer) or alternatively replaced by a three-layer structure of (charge transport layer/light emitting layer/charge transport layer). In the three-layer structure, the two charge transport layers may be different from each other.

These known electron transport layer and light emitting layer are formed by a vacuum vapor deposition method or another known method. When the conjugated polymer and conducting polymer are used, a spin coating method, casting method, dipping method, bar coating method, roll coating method and the like may be used.

As materials for the electron injection cathode of the EL device, preferably used is metals having a small work function which includes Al, In, Mg, Mg—Ag alloy, In—Ag alloy, a graphite thin film, etc. The film thickness of the electron injection cathode is 50 angstroms to 1 micrometer, preferably 500 to 6000 angstroms, and the electron injection cathode is made by a vacuum vapor deposition method, sputtering method and the like.

According to the present invention, the polymer intermediate of the conjugated polymer or the conjugated polymer which are soluble to a solvent is used as the light emitting material, the charge transport material and the buffer layer for the electrode, whereby the EL device having a large area can be easily made. When the buffer layer is used, the uniformity of luminance and light emission is greatly improved.

EL devices according to the present invention is preferably used as a device such as a plane light source as a back light, flat panel display and the like.

The present invention will be specifically described with reference to examples, but is not limited thereto.

EXAMPLE 1

9.6 Grams of 2,5-diheptyloxy-p-xylilenedibromide was subjected to condensation polymerization using 5.0 g of potassium t-butoxide in 80 g of xylene to obtain poly-2,5-diheptyloxy-p-phenylenevinylene (HO-PPV). The chloroform solution thereof was applied to a thickness of 1000 angstroms by a spin coating method at 2000 rpm on a glass substrate on which an ITO thin film had been deposited to a thickness of 200 angstroms by sputtering, to provide a light emitting layer. Further, an aluminum electrode was formed thereon to a thickness of 1000 angstroms by vapor deposition. Terminals were formed to the ITO electrode and aluminium electrode using a silver paste and fixed with an epoxy resin.

When a voltage of 40 V was applied on the thus formed organic EL device, an yellowish orange light having a current density of 2.5 $mA/cm^2$ and a luminance of 0.06 $cd/m^2$ was confirmed. The peak wavelength of the light emitting spectrum was 580 nm and coincided with that of the fluorescent spectrum of the spin-coated thin film of the HO-PPV. Further, the light emitting strength was increased in proportion to the current density.

EXAMPLE 2

2,5-Thienylene bis(dimethylsulfonium bromide) was polymerized using an alkali in the same way as described in Polymer Communication, 28, 229 (1987) and reacted with methanol to obtain poly(2,5-thienylene methoxyethylene) as a polymer intermediate of poly-2,5-thienylenevinylene (hereinafter referred to as PTV). An N,N-dimethylformamide (hereinafter referred to as DMF) solution of the thus obtained polymer intermediate was applied by a spin coating method at 2000 rpm to a thickness of 700 angstroms on a glass substrate on which an ITO thin film was deposited to a thickness of 200 angstroms by sputtering and, thereafter, subjected to a heat treatment in $N_2$ at 200° C. for 2 hours. The film thickness of the polymer intermediate was reduced to 400 angstroms by the heat treatment. When an infrared adsorption spectrum was measured, the absorption peak of 1100 $cm^{-1}$ inherent in the polymer intermediate was found to disappear, and thus a PTV structure was confirmed and the PTV was used as a charge transport layer.

Next, p-xylilene bis(diethylsulfonium bromide) was polymerized in water by adding dropwise an aqueous solution of sodium hydroxide to obtain an aqueous solution of poly(p-phenyleneethylene)sulfonium salt (hereinafter referred to as PPV intermediate) as a polymer intermediate of poly-p-phenylenevinylene (hereinafter referred to as PPV), according to the description of U.S. Pat. No. 4,528,118.

An aqueous solution of the thus obtained PPV intermediate was spin coated at 2000 rpm on a PTV thin film formed on an ITO film. Film thickness at this time was 500 angstroms. Thereafter, the PPV intermediate was subjected to a heat treatment in $N_2$ at 120° C. for 2 hours. The film thickness was 400 angstroms after the heat treatment and it was confirmed by an infrared absorption spectrum that a PPV structure was not perfectly formed and the structure of the PPV intermediate was partially left. Further, an aluminum electrode was formed thereon similarly to Example 1 to complete a device.

When a voltage of 20 V was applied on the thus formed bilayer laminating type device, an yellow light having a luminance of 0.05 $cd/m^2$ was observed at a current density of 25 $mA/cm^2$. The peak wavelength of a light emitting spectrum was 550 nm and coincided with that of the fluorescent spectrum of the thin film of PPV.

EXAMPLE 3

Aniline was subjected to chemical oxidation polymerization using ammonium persulfate as an oxidizing agent to obtain polyaniline (hereinafter referred to as PAn), according to the method described in Molecular Crystals and Liquid Crystals, Part E, 121, pp 173–180 (1985). Thereafter, the polyaniline was treated in an aqueous solution of sodium hydroxide, cleaned and dried, and then dissolved in DMF. The DMF solution of PAn was applied to a thickness of 200 angstroms by a spin coating method at 2000 rpm on a glass substrate on which an ITO film thin was deposited to a thickness of 200 angstroms by sputtering, and, thereafter, dried at 200° C. for 2 hours. Next, perylene was formed on the PAn by a vapor deposition method. Degree of vacuum was $5 \times 10^{-6}$ Torr during the deposition and the film thickness of perylene was 1800 angstroms. An aluminum electrode was formed thereon by vapor deposition to complete an EL device. When a voltage of 45 V was applied on the device, a current having a current density of 42 $mA/cm^2$ flowed and a violet EL emitting light having a luminance of 0.11 $cd/m^2$ was observed. The luminance was in proportion to the current density.

EXAMPLE 4

The poly-2,5-thienylenevinylene intermediate obtained in Example 2 was applied to a thickness of 700 angstroms by a spin coating method at 2000 rpm on a glass substrate on which an ITO thin film was deposited to a thickness of 200 angstroms by sputtering, and, thereafter, subjected to a heat treatment in $N_2$ at 200° C. for 2 hours. The film thickness of the PTV intermediate was reduced to 400 angstroms by the heat treatment. When an infrared absorption spectrum was measured, the absorption peak of 1100 $cm^{-1}$ inherent to the intermediate was found to disappear, and thus a PTV structure was confirmed and the PTV was used as a charge transport material.

Next, the chloroform solution of HO-PPV obtained in Example 1 was applied to a thickness of 1000 angstroms by a spin coating method at 2000 rpm on a PTV thin film on which an ITO thin film had been formed, and the resultant material was used as a light emitting material. An aluminum electrode was formed thereon by vapor deposition to a thickness of 1000 angstroms. Terminals were formed to the ITO electrode and aluminum electrode using a silver paste and fixed with an epoxy resin.

When a voltage of 35 V was applied on the thus formed bilayer laminating type device, an yellowish orange light having a luminance of 0.12 $cd/m^2$ was observed at a current density of 7 $mA/cm^2$. The peak wavelength of a light emitting spectrum was 580 nm and coincided with that of the fluorescent spectrum of the thin film of the HO-PPV. Further, the light emitting strength was increased in proportion to the current density.

EXAMPLE 5

A PPV intermediate was applied to a thickness of 600 angstroms by the same method as described in Example 4 except that the PPV intermediate obtained in Example 2 was used in place of the PTV intermediate. Thereafter, the spin coated film of the PPV intermediate Was subjected to a heat treatment at 370° C. for 2 hours to be made to a PPV thin film. Its film thickness was 300 angstroms after the heat treatment. A change to the PPV structure was confirmed by a change in an infrared absorption spectrum. The PPV thin film was used as a charge transportation film. HO-PPV was spin coated thereon in the same way as in Example 2 and an aluminum electrode was formed by vapor deposition to complete an EL device.

When a voltage of 30 V was applied on the thus formed bilayer laminating type device, an yellowish orange light having a luminance of 0.09 $cd/m^2$ was observed at a current density of 17 $mA/cm^2$. A light emitting spectrum was similar to that in Example 2.

EXAMPLE 6

A PAn film was formed in the same way as in Example 3 and used as a charge transport layer. Further, HO-PPV was spin coated thereon in the same way as in Example 4 and an aluminum electrode was formed by vapor deposition to complete a device.

When a voltage of 50 V was applied on the thus formed bilayer laminating type device, an yellowish orange light having a luminance of 0.04 $cd/m^2$ was observed at a current density of 12 $mA/cm^2$. Further, when the applied voltage was increased to provide a current density of 12 $mA/cm^2$, an yellowish orange light having a luminance of 0.43 $cd/m^2$ was confirmed. The light emitting spectrum was similar to that in Example 2.

EXAMPLE 7

A PAn film was formed in the same way as in Example 3 and used as a charge transport layer. Further, an HO-PPV/ perylene mixture was applied thereon at 2000 rpm using a chloroform solution of the HO-PPV obtained in Example 1 and perylene of 1 mol % to the HO-PPV dissolved therein, and the resultant material was used as a light emitting layer. Further, an aluminum electrode was formed thereon to a thickness of 1000 angstroms by vapor deposition. Terminals were formed to the ITO electrode and aluminum electrode using a silver paste and fixed with an epoxy resin. When a voltage of 60 V was applied on the thus formed device, an yellow orange light having a luminance of 4 cd/m$^2$ was observed at a current density of 50 mA/cm$^2$. A light emitting spectrum had a peak at 580 nm and coincided with that of the single HO-PPV.

EXAMPLE 8

A PAn film was formed in the same way as in Example 3 and used as a charge transport layer, and then a chloroform solution of perylene was spin coated thereon at 2000 rpm. The HO-PPV obtained in Example 1 was further spin coated at 2000 rpm from its chloroform solution, and finally an aluminum electrode was formed by vapor deposition to a thickness of 1050 angstroms. Terminals were formed to the ITO electrode and aluminum electrode using a silver paste and fixed with an epoxy resin. When a voltage of 60 V was applied on the thus formed device, an yellow orange light having a luminance of 13 cd/m$^2$ was observed at a current density of 51 mA/cm$^2$. A light emitting spectrum had a peak at 580 nm and coincided with that of the HO-PPV.

EXAMPLE 9

An aqueous solution of NaBF$_4$ was added to an aqueous solution of the PPV intermediate obtained in example 2 to obtain a PPV intermediate with a counteranion of BF$_4^-$. The PPV intermediate was soluble in DMF and mixed with the PTV intermediate obtained in Example 2 (PPV intermediate/PTV intermediate=20/80). The thus obtained mixed solution of the PPV/PTV intermediate was spin coated at 2000 rpm to a thickness of 500 angstroms, and, thereafter, subjected to a heat treatment in vacuum at 200° C. for 2 hours. The thickness of the coated film was reduced to 300 angstroms by the heat treatment.

The thin film of the mixture of PTV and PPV was used as a charge transfer layer.

Tris (8-quinolinol) aluminum (hereinafter referred to as Alq$_3$) as a light emitting material and indium as an electrode were vapor deposited to a film thickness of 1040 angstroms and 6400 angstroms, respectively. These layers were continuously vapor deposited without breaking vacuum. Degree of vacuum was 3×10$^{-6}$ Torr or less when the vapor deposition was carried out. When a voltage of 30 V was applied on the device, a current having a current density of 205 mA/cm$^2$ flowed and a green EL light having a luminance of 282 cd/m$^2$ was observed. The luminance was in proportion to the current density.

EXAMPLE 10

The DMF solution of the PTV intermediate obtained in Example 2 was applied to a thickness of 500 angstroms by a spin coating method at 2000 rpm on a commercially available ITO/glass substrate ultrasonically cleaned in acetone, and, thereafter, subjected to a heat treatment in vacuum at 200° C. for 2 hours. The film thickness of the PTV intermediate was reduced to 300 angstroms by the heat treatment. When an infrared absorption spectrum was measured, the absorption peak of 1100 cm$^{-1}$ inherent to the intermediate was found to disappear, and thus the PTV structure was confirmed.

Next, TPD as a charge transport material, Alq$_3$ as a light emitting material, and indium as an electrode were sequentially vapor deposited thereon to a film thickness of 1140 angstroms, 1040 angstroms, and 6400 angstroms, respectively. These layers were continuously vapor deposited without breaking vacuum. Degree of vacuum was 3×10$^{-6}$ Torr or less when the vacuum deposition was carried out. When a voltage of 28 V was applied on the device, a current having a current density of 208 mA/cm$^2$ flowed and a green EL light having a luminance of 3992 cd/m$^2$ was observed. The luminance was in proportion to the current density. Further, when observed under a stereoscopic microscope with a magnification of×8, the light was uniformly emitted over the entire device. Table 1 shows the result of measurement of the characteristics and the like of this device.

EXAMPLE 11

An organic EL device was made in the same way as in Example 2 except that the PPV intermediate obtained in Example 2 was used. When a voltage of 35 V was applied on the device, a current having a current density of 190 mA/cm$^2$ flowed and a green EL light having a luminance of 3395 cd/m$^2$ was observed. Table 1 shows the result of observation of the light emitting state and the result of measurement of the characteristics and the like of this device, similarly to Example 10.

EXAMPLE 12

A mixed film of PTV and PPV was formed on an ITO/glass substrate in the same way as in Example 10 except that a mixed solution of the polymer intermediates of PPV and PTV obtained in Example 9 was used in place of the PPV intermediate. Next, TPD, Alq$_3$ and indium were vapor deposited on the thus formed conducting polymer film in the same way as in Example 10, whereby an EL device was made.

When a voltage of 25 V was applied on the thus made device, a light having a luminance of 4606 cd/m$^2$ was observed at a current density of 208 mA/cm$^2$. Table 1 shows the result of observation of the light emitting state and the result of measurement of the characteristics and the like of this device, similarly to Example 10.

EXAMPLE 13

A PAn layer was formed to a thickness of 130 angstroms by a spin coating method at 2000 rpm on an ITO-glass substrate from a DMF solution of the PAn obtained in Example 3, and, thereafter, dried in vacuum at 60° C. for 2 hours. Further, TPD, Alq$_3$ and indium were laminated thereon by vacuum vapor deposition similarly to Example 10, whereby an EL device was made.

When a voltage of 35 V was applied on the thus made device, a green light having a luminance of 4818 cd/m$^2$ was confirmed at a current density of 200 mA/cm$^2$. Table 1 shows the result of observation of the light emitting state and the result of measurement of the characteristics and the like of this device, similarly to Example 10.

COMPARATIVE EXAMPLE 1

An EL device was made in the same way as in Example 9 except that the conducting polymer layer was not provided. When a voltage of 27 V was applied on the thus made EL device, a green light having a luminance of 3022 cd/m$^2$ was confirmed at a current density of 185 mA/cm$^2$. Table 1 shows the result of observation of the light emitting state and the result of measurement of the characteristics and the like of this device, similarly to Example 10.

EXAMPLE 14

A mixed solution of the PPV and PTV intermediates obtained in Example 9 was applied on an ITO-glass substrate to form a film of the mixture of the PPV and PTV intermediates by a method similar to that used in Example 10 to form the film of the PTV intermediate.

Next, TPD as a charge transport material, tetraphenylbutadiene (TPB) as a light emitting material, and indium as an electrode were vapor deposited thereon to a film thickness of 1000 angstroms, 500 angstroms, 450 angstroms and 6200 angstroms, respectively. These layers were continuously vapor deposited without breaking vacuum. Degree of vacuum was $3 \times 10^{-6}$ Torr or less when the vapor deposition was carried out.

When a voltage of 34 V was applied on the device, a current having a current density of 106 mA/cm$^2$ flowed and a blue EL light having a luminance of 960 cd/m$^2$ was observed.

EXAMPLE 15

An EL device was made in the same way as in Example 14 except that tetraphenylcyclopentadiene was used in place of TPB. When a voltage of 40 V was applied on the device, a current having a current density of 60 mA/cm$^2$ flowed and a blue EL light having a luminance of 57 cd/m$^2$ was observed.

obtained by heat treating a polymer intermediate having a repeating unit represented by the formula (4):

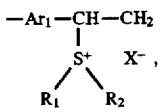
(4)

where Ar$_1$ is the same as defined above, R$_1$ and R$_2$ each represent an alkyl group having 1 to 8 carbon atoms and X$^-$ represents a counteranion, or the formula (5):

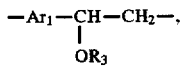
(5)

where Ar$_1$ is the same as defined above and R$_3$ represents a hydrocarbon group having 1 to 12 carbon atoms, at a temperature of 80° to 200° C.

2. An organic electroluminescence device having a light emitting layer or a light emitting layer and a charge transport disposed between a pair of electrodes at least one of which is transparent or semi-transparent, said light emitting layer comprising a conjugated polymer having a degree of polymerization of 10 to 50,000 and a repeating unit represented by the formula (1):

$$—Ar_1—CH=CH—  \quad (1)$$

where Ar$_1$ represents an aromatic hydrocarbon group having 6 to 14 carbon atoms or a nuclear-substituted group in which the aromatic hydrocarbon group is substituted by one or two substituents selected from the group consisting of hydrocar-

TABLE 1

| Example | Conducting Polymer Layer (Type) | Voltage (V) at 100 cd/m$^2$ | Limit Emitting Efficiency at 100 cd/m$^2$ (1 m/w) | Maximum Luminance (cd/m$^2$) | Uniformity of Emitted Light | Layer Thickness (Å) |
|---|---|---|---|---|---|---|
| Example 8 | PTV | 16 | 0.38 | 3992 | B | 300 |
| Example 9 | PPV | 21 | 0.26 | 3395 | C | 120 |
| Example 10 | PTV.PPV | 13 | 0.51 | 4606 | B | 70 |
| Example 11 | PAn | 21 | 0.35 | 4818 | A | 100 |
| Comparative Example 1 | nil | 18 | 0.25 | 3022 | D | |

A: The entire surface emitted light and no unevenness of the light was found.
B: Although the entire surface emitted light, some unevenness of the light was found.
C: Although almost the entire surface emitted light, bright portions and dark ones existed in the luminance of the light.
D: Most portions were dark, although some portions were bright.

What is claimed is:

1. An organic electroluminescence device having a light emitting layer or a light emitting layer and a charge transport layer disposed between a pair of electrodes one of which is electron injecting cathode and at least one of which is transparent or semi-transparent, said light emitting layer comprising a conjugated polymer having a degree of polymerization of 10 to 50,000 and a repeating unit represented by the formula (1):

$$—Ar_1—CH=CH—  \quad (1)$$

where Ar$_1$ represents an aromatic hydrocarbon group having 6 to 14 carbon atoms or a nuclear-substituted group in which the aromatic hydrocarbon group is substituted by one or two substituents selected from the group consisting of hydrocarbon groups having 1 to 22 carbon atoms and alkoxy groups having 1 to 22 carbon atoms, wherein said conjugated polymer is obtained by subjecting a dihalogenide compound represented by the formula (6):

$$X_2—CH_2—Ar_1—CH_2—X_2 \quad (6),$$

where Ar$_1$ is the same as defined above and X$_2$ represents a halogen, to condensation polymerization by an alkali in a solution.

3. An organic electroluminescence device having a light emitting layer or a light emitting layer and a charge transport layer disposed between a pair of electrodes one of which is electron injecting cathode and at least one of which is transparent or semi-transparent, said light emitting layer comprising a conjugated polymer having a degree of polymerization of 10 to 50,000 and a repeating unit represented by the formula (1):

$$-Ar_1-CH=CH- \quad (1)$$

where $Ar_1$ represents an aromatic hydrocarbon group having 6 to 14 carbon atoms or a nuclear-substituted group in which the aromatic hydrocarbon group is substituted by one or two substituents selected from the group consisting of hydrocarbon groups having 1 to 22 carbon atoms and alkoxy groups having 1 to 22 carbon atoms, wherein said conjugated polymer is obtained by reacting a phosphonium salt with a dialdehyde compound represented by the formula (7):

$$CHO-Ar_1-CHO \quad (7)$$

where $Ar_1$ is the same as defined above.

4. An organic electroluminescence device according to claim 1, wherein $Ar_1$ is selected from the group consisting of p-phenylene, 2,6-naphthalenediyl, 9,10-anthracenediyl, mono $C_{1-22}$ alkyl-p-phenylene, mono $C_{1-22}$ alkoxy-p-phenylene, 2,5-di $C_{1-22}$ alkyl-p-phenylene and 2,5-di $C_{1-22}$ alkoxy-p-phenylene.

5. An organic electroluminescence device according to claim 2, wherein $Ar_1$ is selected from the group consisting of p-phenylene, 2,6-naphthalenediyl, 9,10-anthracenediyl, mono $C_{1-22}$ alkyl-p-phenylene, mono $C_{1-22}$ alkoxy-p-phenylene, 2,5-di $C_{1-22}$ alkyl-p-phenylene and 2,5-di $C_{1-22}$ alkoxy-p-phenylene.

6. An organic electroluminescence device according to claim 3, wherein $Ar_1$ is selected from the group consisting of p-phenylene, 2,6-naphthalenediyl, 9,10-anthracenediyl, mono $C_{1-22}$ alkyl-p-phenylene, mono $C_{1-22}$ alkoxy-p-phenylene, 2,5-di $C_{1-22}$ alkyl-p-phenylene and 2,5-di $C_{1-22}$ alkoxy-p-phenylene.

7. An organic electroluminescence device according to claim 4, wherein $Ar_1$ is selected from the group consisting of p-phenylene, 2,5-di $C_{1-22}$ alkyl-p-phenylene and 2,5-di $C_{1-22}$ alkoxy-p-phenylene.

8. An organic electroluminescence device according to claim 7, wherein $Ar_1$ is selected from the group consisting of p-phenylene, 2,5-dimethoxy-p-phenylene, 2,5-diethoxy-p-phenylene, 2,5-dibutoxy-p-phenylene, 2,5-diheptyloxy-p-phenylene and 2,5-dilauryloxy-p-phenylene.

* * * * *